United States Patent [19]

Pass et al.

[11] Patent Number: 4,471,316

[45] Date of Patent: Sep. 11, 1984

[54] ELECTRIC OSCILLATION GENERATOR

[76] Inventors: Matvei I. Pass; Nina S. Ogarkova, both of ulitsa Pushkinskaya, 5, kv. 30; Jury K. Lesish, naberezhnaya Chernoi rechki, 59/2, kv. 24; Lev I. Shapiro, Nevsky prospekt, 134, kv. 121; Jury M. Lebedev, prospekt Kosmonavtov, 82, kv. 17; Oleg V. Filatov, ulitsa Kuibysheva, 1/5, kv. 21, all of Leningrad, U.S.S.R.

[21] Appl. No.: 237,145

[22] Filed: Feb. 10, 1981

[51] Int. Cl.³ ............................................. H03F 3/60
[52] U.S. Cl. .................................... 330/56; 330/109; 330/186; 330/189
[58] Field of Search ................. 330/56, 185, 186, 187, 330/188, 189, 192, 195, 196, 109, 76, 78, 79, 80, 294, 306, 292; 332/31 R

[56] References Cited

U.S. PATENT DOCUMENTS 2,681,953  6/1954  Bradburd ........................ 330/187 X
4,025,873  5/1977  Chilluffo ......................... 330/56 X

FOREIGN PATENT DOCUMENTS 136669  6/1946  Australia ........................ 330/56
290302  8/1928  United Kingdom .
666436  2/1952  United Kingdom .
724682  2/1955  United Kingdom .
776589  6/1957  United Kingdom .
782761  9/1957  United Kingdom .
822591  10/1959 United Kingdom .
906531  9/1962  United Kingdom .

OTHER PUBLICATIONS

D. P. Jinde, "Radioperedajuschie ustroistva", with an English translation, Moscow, Energia Publishers, 1969, pp. 222-227.

S. A. Drobov, "Radioperedajuschie ustroistva", with an English translation, 2nd Edition, Moscow, Publishing House of the USSR Defense Ministry, 1951, pp. 846-849.

D. P. Jinde, "Spravochnik porradioelektronnym ustroistvam", with an English translation, Moscow, Energia Publishers, vol. I, 1978, pp. 232-233.

A. A. Kulikovsky, "Spravochnik radioljubitelya", with an English translation, 2nd Edition, Moscow-Leningrad, 1968, State Publishing House for Literature in Power Engineering, p. 185.

Primary Examiner—James B. Mullins
Attorney, Agent, or Firm—Lilling & Greenspan

[57] ABSTRACT

Disclosed is an electric oscillation generator comprising an exciter and an output amplifier stage utilizing a vacuum tube connected in a common-grid circuit. A section of the input circuit of the vacuum tube is connected to the output of the exciter. The exciter is made as a power supply through a compensating-voltage producing device connected in series with said section of the input circuit and having an output voltage opposite in phase to the voltage across said section of the input circuit of the vacuum tube.

9 Claims, 15 Drawing Figures

ELECTRIC OSCILLATION GENERATOR

FIELD OF THE INVENTION

The present invention relates to radioelectronic devices, and more particularly to electric oscillation generators.

The invention can be used in a variety of systems wherein it is required to produce and amplify electric oscillations. It can be used most advantageously in high-frequency radio and television transmitters, repeaters and other similar apparatus of a vacuum-tube or transistor design.

Background of the Invention

One of the main trends in the development of electric oscillation generators today is to obtain a maximum output power with the highest power gains provided by individual stages of the generator. As is known, the power gain of each stage is smaller the higher is the operating frequency of the generator and the wider is the required passband. Hence, to increase the output power of electric oscillation generators, in particular of high-frequency broad-band ones, the number of their stages should be enlarged.

At the same time, when designing electric oscillation generators, a natural tendency is to reduce their size and weight, improve their reliability, and cut down their cost. However, there is no doubt that the increase of the number of the stages of the generator affects all these parameters.

Thus, when designing generators, one of the main problems is to find an optimum solution to said contradiction between the number of the stages of the generator and its parameters. The most optimum solution of this problem is to increase the power gain of individual stages.

A conventional electric oscillation generator can be represented as comprising two major parts: an exciter and an output amplifier stage whose input is connected to the output of the exciter. The function of the exciter can be performed by any source of electric oscillations which are to be amplified, such as directly by a self-excited oscillator, by a self-excited oscillator with one or more preamplifier stages (one of which can be connected with a modulator) connected to its output, by a receiving antenna with one or more preamplifier stages, or by any other device having electric oscillations produced at its output. The output amplifier stage of the generator contains a controlled active element (a vacuum tube or transistor) with an input and output circuits. A section of the input circuit of the active element forms the input of the amplifier stage. The output circuit of the active element can apply its output signal, for example, to a transmitter antenna or to a further amplifier stage, converter stage, etc. if the generator is a component part of a more complex system.

The specific features of an electric oscillation generator are determined to a great extent by a circuit diagram of the input and output circuits of the active element of the output amplifier stage, and more particularly by the selection of a common point for the input and output circuits.

Description of the Prior Art

Known in the art are electric oscillation generators (Cf. D. P. Linde, "Radioperedajuschie ustroistva" /Radio-Transmitting Devices/, "Energia" Publishing Company, Moscow, 1969, pp. 222-227, particularly FIG. 5-1) comprising an exciter and an output amplifier stage to amplify the power of electric oscillations supplied thereto from the exciter, said output amplifier stage utilizing a controlled active element, such as a vacuum tube, with an input and output circuits. The input circuit of the active element in such generators is connected between the emitting and control electrodes of the active element (between the cathode and control grid of the vacuum tube), and its section is connected to the output of the exciter. The output circuit is connected between the emitting and collector electrodes of the active element (between the cathode and anode of the vacuum tube). In such a generator the current of oscillations supplied from the exciter to the amplifier stage flows through the input circuit of the active element, and in the output circuit there is a current of the active element, determined by a voltage on its control electrode.

Such a connection of the active element classifies a common-cathode type of generators (a common-emitter type when a transistor is used).

In the amplifier stage of the generators of this type a rather high power gain can be obtained, which in real devices may amount to values of about 100. However, such a high power gain can be achieved only within a narrow frequency band. The passband can be widened only by shunting the input circuit of the amplifier stage with a resistance which consumes a portion of the exciter power as a result of which the power gain decreases in proportion to widening of the generator operating frequency band.

As is known, the use of such generators in the range of high frequencies (starting with a short-wave band), if a triode or transistor is employed therein, is limited due to presence of a parasitic feedback caused by the capacitance between the collector and control electrodes (such as an anode-to-grid capacitance of a triode), sharply reducing its stability against self-excitation and affecting the performance of the generator; and, if a tetrode is employed, the use of such generators is limited due to almost insuperable constructional and manufacturing difficulties attendent upon the necessity to provide equal potentials of a cathode and a screen grid for high frequencies, which makes it impossible to fabricate simple, inexpensive and reliable tetrodes intended for operation with high power outputs, particularly within metric and decimetric wave bands. As a result, common-cathode (common-emitter) circuits are primarily employed in low-frequency generators.

Also known in the art are electric oscillation generators (Cf. S. A. Drobov, "Radioperedajuschie ustroistva" /Radio-Transmitting Devices/, "Voennoe Izdatelstvo" Publishing Company, Moscow, 1951, pp. 846–849) comprising an exciter and an output amplifier stage to ampify the power of electric oscillations supplied thereto from the exciter, said output amplifier stage utilizing a controlled active element, such as a vacuum tube, with an input circuit connected between the emitting and control electrodes of the active element, whose section is connected to the output of the exciter, and with an output circuit connected to the collector electrode of the active element and electrically coupled with its control electrode and with the exciter output such that at least a portion of the current of oscillations fed from the exciter to the amplifier stage flows therethrough.

Such a connection classifies a common-grid type of generators (a common-base type when a transistor is used).

The generators of this type have found wide application in a variety of apparatus used in the range of high frequencies (within metric, decimetric and centimetric wave bands). This is explained by a number of positive features typical of such generators.

In distinction to common-cathode generators, common-grid generators exhibit an increased stability against self-excitation since parasitic feedback therein is determined by a capacitance between the collector and emitting electrodes (such as between the anode and cathode of a triode) which is at least by an order lower than that between the collector and control electrodes. When a tetrode is used as the controlled active element of the amplifier stage, the control and screen grids are short-circuited for high frequencies. In this case the value of the anode-to-cathode capacitance is still lower than that in a triode, which additionally improves the stability of the generators of this type against self-excitation, equal potentials of the control and screen grids for high frequencies being provided quite easily.

Due to the fact that in common-grid (common-base) generators a portion of the current of oscillations supplied from the exciter to the amplifier stage, i.e. a portion of the drive current, flows through the output circuit of the active element, wherein a useful load is incorporated, the input circuit of the amplifier stage appears to be shunted by an impedance having a value (if grid currents are absent) equal to an inverse grid-anode transconductance of the active element. Owing to this, such generators have a broad passband.

Said positive features of prior-art common-grid (common-base) generators have enabled them to supplant almost completely common-cathode (common-emitter) generators in the range of high and superhigh frequencies (particularly in broad-band devices).

However, the power gain of the amplifier stage of the common-grid (common-base) generator is very small since the exciter develops in the load of the amplifier stage a power caused by the current of the amplifier stage active element, flowing through the exciter. To provide the operation of the amplifier stage in such generators, a powerful exciter is required which produces at its output oscillations whose voltage is equal to that on the control electrode of the amplifier stage active element and the current corresponds to that of the active element. In other words, when constructing generators of high and medium power, a multistage exciter should be used which can yield at its output a power sufficient to operate (to drive) the output amplifier stage. This results in the complication of the design of the generator, in the increase of its size and weight, in the rise of its cost, and in the degradation of its reliability. Besides, this brings about additional maintenance difficulties associated with tuning of multistage systems and causes the growth of energy consumption and the increase in nonlinear distortions and losses.

For a few decades the generators with common-grid (common-base) amplifier stages have not been seriously modified. Only their component elements were perfected, that is vacuum-tube and solid-stage devices, the elements of oscillatory systems, and coupling elements, as well as improved was the technology. Specifically, there were developed vacuum tubes with increased transconductances and reduced values of an interelectrode capacitance and electronic devices with oscillatory systems built into an evacuated buld. However, this has not given a substantial increase in the power gain, the construction of the vacuum tubes and the process of their fabrication being significantly complicated.

Thus, the power gain in the majority of prior-art generators with common-grid amplifier stages is in the range from 3 to 20, and in the best present-day generators in which the latest achievements in electronics are employed the power gain is about 30 (Cf. "Spravochnik po radioelektronnym ustroistvam" /Guidebook in Radioelectronic Devices/, edited by D. P. Linde, "Energia" Publishing Company, Moscow, 1978, volume 1, paragraph 3—3, in particular p. 233). In this case the necessity to use a sufficiently powerful exciter is retained in all instances, and to obtain a required output power the number of preamplifier stages thus should be enlarged with all said adverse consequences.

At present it is considered that conventional ways of perfecting such generators have practically exhausted, and the power gain of about 30 is, probably, a limiting value for them. The belief that the power gain in such generators cannot be appreciably increased has become traditional, and the increase of the power gain even by a few percent is considered to be an impressive progress.

Said features of such generators restrain further development of powerful high-frequency broad-band vacuum-tube and transistor radio apparatus, particularly of mobile ones for which small size, low weight, high reliability and improved performance are of particular importance.

Summary of the Invention

The principal object of the present invention is to provide an electric oscillation generator with a common-grid (common-base) output amplifier stage, the generator being improved such as to achieve a substantial increase in the power gain of the output amplifier stage by reducing the power required to drive the amplifier stage without varying its mode of operation, the broad passband of the amplifier stage and its high stability against self-excitation being retained.

With this principal object in view, there is provided an electric oscillation generator comprising an exciter and an output amplifier stage to amplify the power of electric oscillations supplied thereto from the exciter, utilizing a controlled active element, such as a vacuum tube, with an input circuit connected between the emitting and control electrodes of the active element and having its section connected to the output of the exciter and with an output circuit connected to the collector electrode of the active element and electrically coupled with its control electrode and with the output of the exciter such that at least a portion of the current of oscillations supplied from the exciter to the amplifier stage flows therethrough, according to the invention the exciter is made with respect to the circuits of the amplifier stage connected to its output as a power supply, and said section of the input circuit of the active element is connected to the output of the exciter through a compensating-voltage producing device in series with this section of the input circuit, whose output voltage has a frequency equal to the frequency of oscillations supplied from the exciter to the amplifier stage and is phase shifted with respect to the voltage across said section of the input circuit such that the sum of these two voltages is less than the voltage across said section of the input circuit.

With such a design of the generator, the control-electrode voltage of the active element is determined by the current of oscillations supplied from the exciter to the amplifier stage and by the impedance of the active element input circuit, i.e. the mode of operation of the common-grid (common-base) amplifier stage is not changed, but the voltage across the output of the exciter is equal to the sum of the voltage across the section of the active element input circuit and the compensating voltage, and this sum is always less than the voltage across the input circuit section. Thus, to drive the output amplifier stage by the exciter, as well as in prior-art generators, required is a current sufficient to provide on the control electrode of the active element such a voltage which is needed to maintain a specified duty of the active element and to obtain in the load a required output current (which is a portion of the output current of the exciter), but the voltage across the exciter output therewith is appreciably lower than that in prior-art generators. Considering that the power of the exciter is defined as the product of its output current by the output voltage, a less powerful exciter is required in the generator according to the invention to obtain the same power in the useful lead, and when the voltage across said section of the active element input circuit and the compensating voltage are opposite in phase and equal in amplitude, the required power of the exciter drops practically to zero since its output voltage determined by the sum of two voltages equal in amplitude but opposite in phase may be equal to zero.

Thus, the present invention makes it possible to improve sharply the power gain provided by the output amplifier stage, which in turn enables the number of amplifier stages in the exciter to be appreciably reduced with retention of the generator output power and thus provides simplification of the construction of the generator as a whole, reduction of its size and weight, improvement of the reliability, drop in its cost, and a simplified maintenance thereof.

At the same time, due to the fact that the exciter is made as a power supply, introduction of the source of compensating voltage into the circuit of the generator does not give rise to any new parasitic feedback, which makes it possible to retain a broad passband of the output amplifier stage and its high stability against self-excitation in the range of high frequencies.

When a source of amplitude-modulated oscillations is used as the exciter, the compensating-voltage producing device may be made as a source of alternating voltage nonmodulated in amplitude, which is synchronized with the exciter and has its output circuit connected in series with said section of the active element input circuit and communicating this section with the exciter output.

For a majority of radioelectronic apparatus it is advisable to make the compensating-voltage producing device as a passive multiterminal network having one of its terminals electrically coupled with the active element collector electrode and two terminals connected, respectively, with the exciter output and with said section of the active element input circuit so that the circuit of the multi-terminal network between these two terminals is in series with said section of the input circuit, the multi-terminal network being made such that flowing therethrough of at least a portion of the current of oscillations supplied from the exciter to the amplifier stage produces between said two terminals a voltage phase shifted with respect to the voltage across said section of the input circuit so that the sum of these two voltages is less than the voltage across said section of the input circuit.

In so doing, the compensating voltage is produced on the passive elements of the multi-terminal network introduced directly into the output amplifier stage due to the flow of the output current of the exciter via the circuits of the multi-terminal network. Such a construction can do without additional stages with active elements, does not require special synchronization, and therefore features simplicity and reliability. Besides, such a generator is more economical since the compensating voltage is produced therein not due to any external sources requiring power supply, but directly in the amplifier stage due to energy redistribution in the circuits of the active element.

In resonant high-frequency generators it is advisable to make the passive multi-terminal network performing the function of the compensating-voltage producing device as a parallel resonant oscillatory circuit one of whose branches is made as a voltage divider formed by two reactances of the same sign, a first extreme point of this voltage divider being electrically coupled with the collector electrode of the active element and a middle point and second extreme point thereof being connected with the exciter output and with said section of the active element input circuit, respectively.

Such a connection of the passive multi-terminal network in the resonant generator is simpler and more efficient in design. Besides, this provides a high stability of the output amplifier stage against self-excitation not only within an operating frequency band, but also outside thereof.

Said parallel resonant oscillatory circuit may be connected such as to form the output circuit of the active element of the amplifier stage.

Such a combination of the functions of the oscillatory circuit acting as the compensating-voltage producing device and as the output circuit of the amplifier stage additionally simplifies the construction of the generator. Besides, in this case there is provided an automatic protection of the active element (which is of particular importance for operation of high-power generators) against overloading its electrodes when the output oscillatory circuit is detuned since detuning of this circuit results in a sharp decrease of the compensating voltage as a result of which the voltage on the control electrode of the active element drops off and the current flow in it ceases. This construction is the most efficient with the use of three-electrode active elements (triodes) in the range of high frequencies.

When a tetrode is used as the controlled active element of the amplifier stage, said parallel resonant oscillatory circuit may be connected between the control and screen grids of the tetrode, the first extreme point of said voltage divider being electrically coupled with the collector electrode (anode) of the tetrode through its output circuit.

This enables the value of the compensating voltage to be independent of the resistance of the useful load of the tetrode output circuit, which of great importance when the generator drives a variable load.

In broad-band generators, to obtain a required compensating voltage within the entire operating frequency band, the passive multi-terminal network forming the compensating-voltage producing device may be made as a system of coupled oscillatory circuits one of which is a parallel resonant oscillatory circuit with two branches having a first point of connection thereof electrically coupled with the collector electrode of the active element and a second point connected to said section of the active element input circuit, the other resonant oscillatory circuit of said system being connected such that its network having a voltage close in phase to the voltage across said parallel resonant oscillatory circuit is interposed between said second point of connection of the branches of the parallel oscillatory circuit and the exciter output.

Said system of coupled resonant oscillatory circuits may be connected such that it forms the output circuit of the amplifier stage active element. This makes it possible to simplify the construction of the generator and to provide the protection of the active element against overloads within a broad operating frequency band.

To enable the compensating voltage to be independent of the resistance of the useful load within a broad frequency band in the output circuit of the amplifier stage active element with the use of a tetrode as the controlled active element of the amplifier stage, the system of coupled oscillatory circuits may be made such that the parallel resonant oscillatory circuit incorporated therein is connected between the control and screen grids of the triode, the first point of connection of the branches of this oscillatory circuit being electrically coupled with the collector electrode (anode) of the tetrode via its output circuit.

To simplify making the exciter as a power supply, i.e. to enable the current to be independent of the voltage across the exciter output in high-frequency generators in which the exciter comprises a source of high-frequency oscillations, it is advisable to couple the exciter with the amplifier stage through a matching device placed at the output of the source of high-frequency oscillations and based on a nonreciprocal passive four-terminal network whose input is connected to its output by a segment of a line such that an overall electrical length of this line segment together with said four-terminal network is not a multiple of the length of a half-wave of oscillations produced by the source of high-frequency oscillations, the matching device having an input transmission line connected to the input of the four-terminal network parallel to said line segment and electrically coupled with the output of the source of high-frequency oscillations, and an output transmission line series-connected into a break of one of the conductors of said line segment at its section between the output of said four-terminal network and the point of connection of the input transmission line and forming the exciter output.

Introduction of such a matching device makes it possible to increase the internal impedance of the exciter as viewed from the amplifier stage and to provide simultaneously matching and decoupling of the exciter output with respect to the amplifier stage circuits. At the same time the influence of feeder circuits communicating the exciter with the amplifier stage on the internal impedance of the exciter is also decreased.

It is advisable to introduce into said matching device an additional nonreciprocal passive multi-terminal network connected in a forward direction into said input transmission line between the point of its connection with said line segment and the output of the source of high-frequency oscillations.

This provides stability of the internal impedance of the exciter as viewed from the amplifier stage and enables this impedance to be independent of the construcion and parameters of the source of high-frequency oscillations.

To provide an additional increase in the internal impedance of the exciter as viewed from the amplifier stage, particularly in low-power generators, this impedance being independent of the construction and parameters of the source of high-frequency oscillations, it is advisable to use as the nonreciprocal passive multi-terminal network connected into the input transmission line of the matching device a circulator which is connected into said input transmission line at a distance from the point of its connection to said line segment, equal to an odd number of quarters of the wavelength of oscillations produced by the source of high-frequency oscillations, such that an input port of the circulator faces the output of the source of high-frequency oscillations and an output port of the circulator faces said line segment and is connected to a ballast port of the circulator through a transmission line into which another nonreciprocal passive multi-terminal network is connected in a forward direction such that an overal electrical length of this transmission line together with the circulator and multi-terminal network included therein is a multiple of the wavelength of oscillations produced by the source of high-frequency oscillations.

For all considered embodiments of the matching device in the generator according to the invention it is advisable to introduce into this matching device parallel to said line segment between the points of connection of the input transmission line to this device and the output of the nonreciprocal passive four-terminal network a reactance having a sign opposite to that of the reactance of said line segment at the points of connection of the input transmission line thereto and an absolute value exceeding half of the absolute value of the reactance of said line segment at said points.

This provides transformation (increase) of the current generated by the source of high-frequency oscillations without transforming the impedance, which makes it possible to use a less powerful source of high-frequency oscillations with a lower output current, an additional increase being achieved in the power gain of the output amplifier stage relative to the power at the output of the source of high-frequency oscillations, which is proportional to the square of the ratio of the current at the output of the matching device, i.e. at the exciter output, to the current at the output of the source of high-frequency oscillations.

BRIEF DESCRIPTION OF THE DRAWINGS

These and other features and advantages of the invention, as well as particular objects thereof, will become more apparent from the following detailed description of its embodiments taken with reference to the accompanying drawings.

FIG. 11 shows a schematic circuit diagram of the electric oscillation generator with a triode amplifier stage and a compensating-voltage producing device made as a system of two coupled oscillatory circuits which forms the output circuit of the triode;

Figure 1:
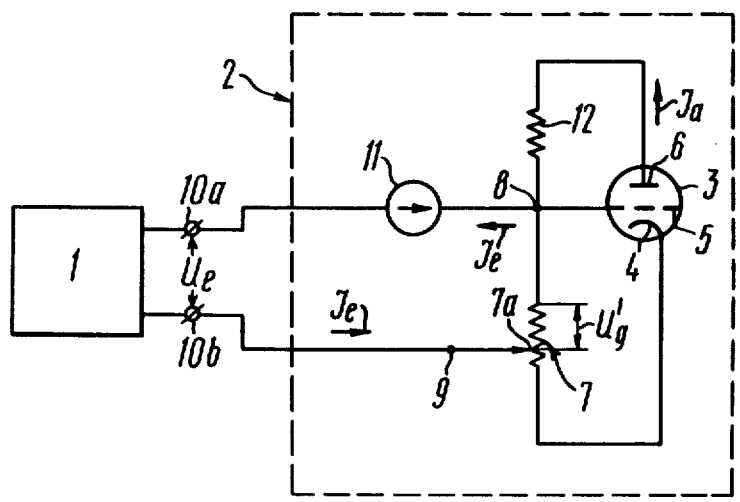
FIG. 1 shows a circuit diagram of the electric oscillation generator according to the invention.

For simplicity, all the aforementioned drawings show only the diagrams of circuits conducting alternating current (the current of high-frequency oscillations). Power supplies, such as the sources of a filament voltage of vacuum tubes, anode voltage, bias voltage, etc., connected in the usual way, as well as other elements typical of like apparatus, such as decoupling chokes in power supply leads, are not shown in the drawings.

Detailed Description of the Invention

In a general form an electric oscillation generator (FIG. 1) comprises an exciter 1 and an output amplifier stage 2 which serves to simplify the power of electric oscillations supplied thereto from the exciter 1.

The output amplifier stage 2 utilizes a controlled active element, that is a vacuum tube—a triode 3 in which a cathode 4, grid 5, and anode 6 are emitting, control, and collector electrodes, respectively.

The input circuit of the triode 3 comprises an impedance 7 usually reactive in its effect which is connected between the cathode 4 and grid 5 of the triode 3. A portion of the impedance 7 forms a section 7a of the input circuit of the triode 3, bounded by points 8 and 9 and connected to output terminals 10a and 10b of the exciter 1. The terminal 10a communicates with the point 8 of the section 7a via a compensating-voltage producing device 11 and the terminal 10b is directly connected to the point 9 of the section 7a such that the compensating-voltage producing deive 11 is series-connected to the section 7a of the input circuit of the triode 3 with respect to the output of the exciter 1.

The output circuit of the triode 3 contains a useful load 12 whose impedance is resistive in its effect in the range of high frequencies of the generator and which is interposed between the grid 5 and anode 6 of the triode 3. Thus, the output circuit with the load 12 is electrically coupled directly with the grid 5 of the triode 3 and connected thereto at the point 8 of connection on the section 7a of the input circuit, and with the output of the exciter 1, i.e. with its output terminal 10a. The input circuit is electrically coupled through the compensating-voltage producing device 11 such that a portion of the current of oscillations supplied from the exciter 1 to the output amplifier stage 2 flows through the output circuit of the triode 3, i.e. through the load 12.

The output circuit of the triode 3 with the load 12 is the output circuit of the generator. The function of the load 12 may be performed, for example, by the antenna of a transmitter or by a further amplifier stage in more complex systems.

The exciter 1 is made relative to the circuits of the amplifier stage 2 connected to its output terminals 10a and 10b as a power supply, i.e. its internal impedance is much greater than the input impedance of the stage 2 between the points 10a and 10b whereto all the circuits of the stage 2 are connected.

The compensating-voltage producing device 11 is made such that it produces between the points 8 and 10a a voltage whose frequency is equal to that of oscillations supplied from the exciter 1 to the amplifier stage 2 and which is phase shifted relative to the voltage across the section 7a of the input circuit such that the sum of these two voltages is less than the voltage across the section 7a, i.e. the device 11 produces a compensating voltage which is approximately opposite in phase to the voltage across the section 7a.

The electric oscillation generator operates as follows.

When supply voltages are applied to the exciter 1 and to the output amplifier stage 2, there appear at the output of the exciter 1 electric oscillations characterized by a drive alternating current $I_e$ and an output alternating voltage $U_e$. A portion of the drive current $I_e$ flows through the input circuit of the triode 3 and develops across its section 7a an input alternating voltage $U_g$ as well as produces a control alternating voltage $U_g$ which is applied between the cathode 4 and grid 5 of the triode 3. As a result of the control voltage $U_g$ developed on the grid 5, there appears in the triode 3 an alternating electron (anode) current $I_a$ flowing from the cathode 4 to the anode 6 and returning to the cathode 4 via the output circuit with the load 12, device 11 and exciter 1. Hence, the anode current $I_a$ constitutes a portion of the drive current $I_e$ which in accordance with the values of impedances is distributed between the input and output circuits of the triode 3. As the current $I_a$ flows via the load 12, the latter produces power-amplified oscillations whose oscillatory power is determined by the current $I_a$ and by the resistance of the load 12.

The device 11 produces between the points 8 and 10a a compensating voltage $U_k$ of a frequency equal to the frequency of oscillations supplied from the exciter 1 to the amplifier stage 2, i.e. to the frequency of the drive current $I_e$, the phase of the compensating voltage $U_k$ being approximately opposite to that of the voltage $U_g'$ across the section 7a of the input circuit of the triode 3 and the amplitudes of these two voltage $U_k$ and $U_g'$ being approximately equal. The output voltage $U_e$ of the exciter 1 is equal to the sum of the compensating voltage $U_k$ between the points 8 and 10a and the input voltage $U_g'$ across the section 7a of the input circuit of the triode 3, acting between the points 8 and 9, i.e. between the points 8 and 10b. Since the compensating voltage $U_k$ and the input voltage $U_g'$ are approximately opposite in phase, their sum is always less than the value of any of them, and hence the output voltage $U_e$ of the exciter 1 is always lower than the input voltage $U_g'$.

The output power of the exciter 1 is determined as the product of the drive current $I_e$ by the output voltage $U_e$. Thus, the reduction in the output voltage $U_e$ caused by the introduction of the compensating voltage $U_k$, the drive current $I_e$ being constant, involves a decrease in the power taken off from the exciter 1, which is necessary to maintain such an operation of the amplifier stage 2 that provides a required power in the load 12.

The ratio of the current Ia flowing via the output circuit of the triode 3 to the current flowing via its input circuit, i.e. the ratio characterizing distribution of the drive current $I_e$ between the input and output circuits of the triode 3, is equal to the product of the grid-anode transconductance of the triode 3 by the value of the impedance 7 of the input circuit and by the ratio of the voltage $U_g$ between the cathode 4 and the grid 5 to the voltage $U_g'$ across the section 7a of the input circuit of the triode 3. Since the exciter 1 is a power supply with respect to the amplifier stage 2, i.e. the drive current $I_e$ is independent of the input impedance of the stage 2 connected to the output of the exciter 1, said ratio between the currents in the input and output circuits of the triode 3 is independent of the value of the compensating voltage $U_k$. From this it follows that the control voltage $U_g$ on the grid 5 of the triode 3 and, hence, the anode current $I_a$ are defined only by the drive current $I_e$ and independent of the value of the compensating voltage $U_k$.

Thus, the value of the compensating voltage $U_k$ has no influence on the operation of the amplifier stage 2 and determines only the power taken off from the exciter 1 to provide a required control voltage $U_g$ on the grid 5 of the triode 3.

Figure 2:
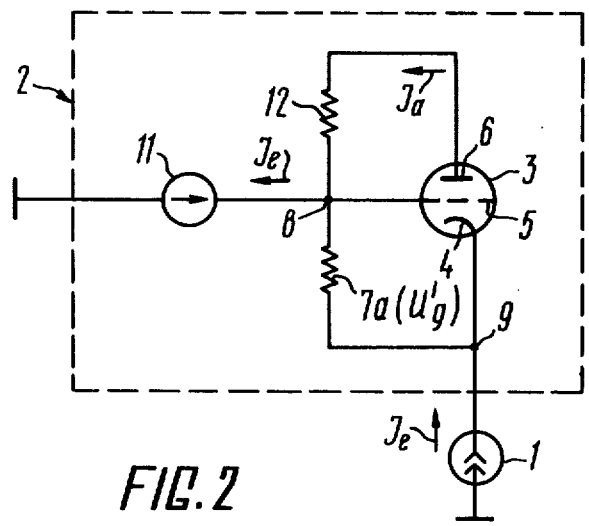
FIG. 2 shows an equivalent circuit diagram of the electric oscillation generator shown in FIG. 1.

Let us analyze the relation between this power and the value of the compensating voltage $U_k$ provided that the drive current $I_e$ is constant, i.e. the operating conditions of the amplifier stage do not vary. To illustrate the analyses, FIG. 2 shows an equivalent circuit diagram of the generator under consideration.

When the compensating voltage $U_k$ is equal in amplitude and opposite in sign (in phase) to the input voltage $U_g'$ across the section 7a of the input circuit of the triode 3, the output power of the exciter 1 is equal to zero since its output voltage $U_e$ is also zero, the power gain provided by the amplifier stage 2 (determined as the ratio of the output power of the generator developed in the load 12 to the output power of the exciter 1) tending to infinity. In other words, the exciter 1 does not expend power to drive the amplifier stage 2 and provides only the drive current $I_e$ which is required to produce on the grid 5 of the triode 3 the control voltage $U_g$ defining the operating conditions of the triode 3 and its anode current $I_a$ and, hence, the output oscillatory power developed in the useful load 12.

When the compensating voltage $U_k$ is opposite in phase to the voltage $U_g'$ and exceeds it in amplitude, the output voltage $U_e$ of the exciter 1 becomes opposite in phase to the drive current $I_e$, the exciter 1 not giving up its power, but consuming it from the amplifier stage 2. The excessive power supplied to the exciter 1 is dissipated in its circuits, such as in the anode of the active element of the output stage of the exciter 1 or in a special ballast load. Hence, in this case also only the drive current $I_e$ is required from the exciter 1 and the power is not needed, and the power gain of the amplifier stage grows to infinity.

If the compensating voltage $U_k$ is opposite in phase to the input voltage $U_g'$ and slightly lower in amplitude, the output voltage $U_e$ nevertheless will be always lower than the voltage $U_g'$ the power given up by the the exciter 1 being always less than that in a similar prior-art generator in which the exciter output is directly connected to the section of the input circuit of the amplifier stage active element and the output voltage of the exciter is equal to the voltage across the section of the input circuit. Hence, in this case the power gain of the amplifier stage 2 will be also higher than that in the prior-art generator, i.e. to provide a required output power in the load 12 the generator under consideration requires a sufficiently less powerful exciter 1, all other things being equal.

Thus, in the electric oscillation generator described hereinabove the power gain of the output amplifier stage 2 is increased in all cases as many times as the output power of the exciter 1 is reduced.

As it follows from the circuit diagram of the generator (FIGS. 1 and 2), with a constant drive current $I_e$, variations in the output voltage $U_e$ of the exciter 1 (which is the power supply) due to introduction of the compensating voltage $U_k$ do not bring about any additional feedback between the input and output circuits of the triode 3 as compared to the prior-art generator with a common-grid amplifier stage. A parasitic feedback in the generator under consideration is also defined by an interelectrode (anode-to-cathode) capacitance. Thus, the generator described hereinabove retains all the positive features of a commongrid circuit, primarily a high stability of the amplifier stage against self-excitation and a broad-band characteristic thereof.

Figure 3:
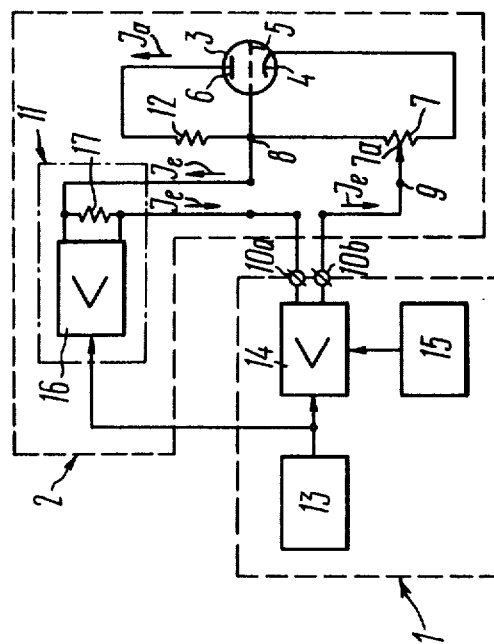
FIG. 3 shows a circuit diagram of the electric oscillation generator wherein the compensating-voltage producing device is made as a source of nonmodulated alternating voltage.

FIG. 3 shows a simplified functional circuit diagram of the electric oscillation generator in which the compensating-voltage producing device is made as a source of nonmodulated alternating voltage.

In this generator the exciter 1 comprises a master oscillator 13 and an amplifier stage 14 whose input is connected to the output of the master oscillator 13. The amplifier stage 14 has an amplitude modulator 15 connected thereto in a conventional way. The output terminals of the amplifier stage 14 form the output terminals 10a and 10b of the exciter 1.

The master oscillator 13, the amplifier stage 14 and the modulator 15 may be made in accordance with any known circuit diagram, the amplifier stage 14 being made such that its internal impedance is much greater than the input impedance of the output amplifier stage 2 connected to the terminals 10a and 10b of the exciter 1 to provide the operation of the exciter as a power supply, i.e. to enable the drive current to be independent of the output voltage of the exciter 1.

The compensating-voltage producing device 11 in the output amplifier stage 2 is made as an independent source of alternating voltage nonmodulated in amplitude, which is formed by an amplifier stage 16 whose input is connected to the output of the master oscillator 13, and that provides synchronization of the amplifier stage 16 with the exciter 1. An output circuit 17 of the amplifier stage 16, shown in the drawing in a general form as a resistance, is series-connected to the section 7a of the input circuit of the triode 3 and communicates the point 8 of the section 7a with the output terminal 10a of the exciter 1. The point 9 of the section 7a is connected directly to the output terminal 10b of the exciter 1 as shown in FIG. 1.

The amplifier stage 16 may be made in accordance with any known circuit diagram, for example in the same way as the stage 14, but without an input for a modulator. Depending on the operating frequency band of the generator, the output circuit 17 of the amplifier stage 16 may be formed, for example, by a transformer winding or by a resonant oscillatory circuit.

When such a generator is in operation, the master oscillator 13 produces electric oscillations of a carrier frequency which are supplied simultaneously to the amplifier stage 14 of the exciter 1 and to the amplifier stage 16. The amplifier stage 14 is also supplied with oscillations of a modulating frequency fed from the modulator 15. The amplifier stage 14 delivers at its output carrier-frequency oscillations modulated in amplitude with the frequency of oscillations supplied from the modulator 15.

The carrier-frequency oscillations are not modulated in the amplifier stage 16 and delivered at its output (in the output circuit 17) with a constant amplitude defined by the power gain of the stage 16 which is chosen such that the amplitude of the voltage across the output of the stage 16 is approximately equal to the maximum amplitude of the input voltage $U_g'$ developed by the drive current $I_e$ in the section 7a of the input circuit of the triode 3.

The voltage thus produced across the output of the stage 16 is the compensating voltage $U_k$ which is in phase with the output voltage $U_e$ of the exciter 1 and, hence, opposite in phase to the input voltage $U_g'$ which is dependent only on the drive current $I_e$ as in the generator shown in FIG. 1, i.e. in this case it is modulated in amplitude.

In this case the output voltage $U_e$ of the exciter 1, representing an algebraic sum of the voltages $U_k$ and $U_g'$, has a variable amplitude which corresponds to the difference between a constant amplitude $U_k$ and a variable amplitude $U_g'$ and which, hence, is always lower than the amplitude $U_g'$ and that makes it possible to reduce the power taken off from the exciter 1.

Otherwise, the operation of such a generator is similar to that of the generator shown in FIG. 1.

The aforementioned construction of the electric oscillation generator according to FIG. 3 with an independent (external) source of compensating voltage may be recommended for use primarily when modernizing in accordance with the present invention existing generators in which for some reason or other it is impossible to introduce a compensating-voltage producing device directly into the structure of the input or output circuit of the output amplifier stage.

Figure 4:
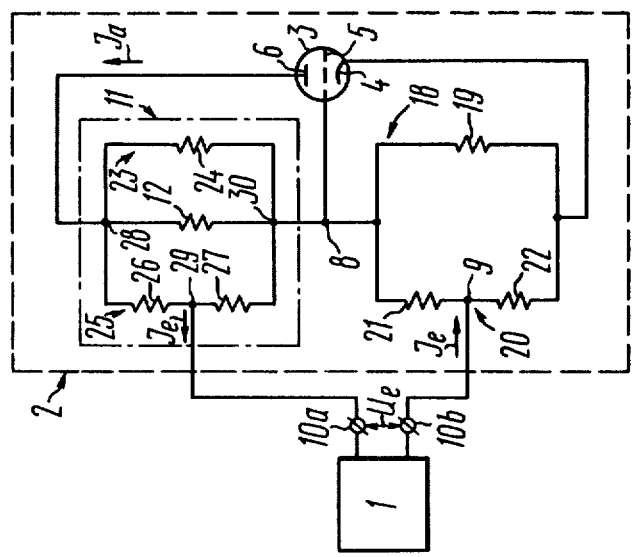
FIG. 4 shows a circuit diagram of the electric oscillation generator with a triode amplifier stage and a compensating-voltage producing device made as a parallel resonant oscillatory circuit forming the output circuit of the triode.

In the electric oscillation generator whose functional circuit diagram is shown in FIG. 4 the output amplifier stage utilizes a triode with input and output circuits made as parallel resonant oscillatory circuits, i.e. represents a tuned amplifier.

The input circuit of the triode 3 in this generator is made as parallel resonant oscillatory circuit whose one branch 18 contains a reactance 19 and another branch 20 contains two reactances 21 and 22 connected in series. The reactance of the branch 18 is opposite in sign to the total reactance of the branch 20. For example, if the reactance of the branch 18 is capacitive in its effect, the total reactance of the branch 20 is of inductive nature. One of the points of connection of the branches 18 and 20 is connected to the grid 5 and the other is connected to the cathode 4 of the triode 3. Thus, the oscillatory circuit which is the input circuit of the triode 3 is connected between its cathode 4 and grid 5. A common point of the reactances 21 and 22 is connected to the output terminal 10b of the exciter 1.

The values of the reactances 19, 21 and 22 of the oscillatory circuit forming the input circuit of the triode 3 are chosen such that this oscillatory circuit is tuned to the center frequency of the operating frequency band of the generator.

The compensating-voltage producing device 11 is made as a passive three-terminal network which is formed by a second parallel resonant oscillatory circuit forming at the same time the output circuit of the triode 3. In this oscillatory circuit one branch 23 contains a reactance 24 and another branch 25 is made as a voltage divider formed by two reactances 26 and 27 of the same sign opposite to that of the reactance 24 of the branch 23. A first extreme point 28 of the voltage divider forming the branch 25 of the oscillatory circuit is connected directly to the anode 6 of the triode 3. A middle point 29 of this divider (a point of connection of the reactances 26 and 27) is connected to the output terminal 10a of the exciter 1. A second extreme point 30 of said divider is connected to the grid 5 of the triode 3. The extreme points 28 and 30 of the voltage divider are also the points of connection of the branches 23 and 25. The useful load 12 is connected parallel to the branches 23 and 25. The values of the reactances 24, 26 and 27 of the oscillatory circuit forming the output circuit of the triode 3 are chosen such that this oscillatory circuit is tuned to the center frequency of the operating frequency band of the generator.

Thus, the reactance 21 forms a section of the input circuit of the triode 3, connected to the output of the exciter 1 in series with the compensating-voltage producing device 11, the point of connection of the grid 5 of the triode 3 with the extreme point 30 of the voltage divider formed by the reactances 26 and 27 and with the point of connection of the branches 18 and 20 of the oscillatory circuit forming the input circuit of the triode 3 being the point 8 which bounds said section of the input circuit at its one end and the point of connection of the reactances 21 and 22 being the other point 9 which bounds this section of the input circuit at the other end thereof.

In the course of operation of the electric oscillation generator whose functional diagram is shown in FIG. 4 a portion of the drive current $I_e$ flowing via the reactance 21 of the input circuit of the triode 3 produces the input voltage $U_g'$ of the amplifier stage 2, acting between the points 8 and 9, the control voltage $U_g$ inphase with the voltage $U_g'$ appearing between the cathode 4 and grid 5 of the triode 3. The anode current $I_a$ of the triode 3 proportional to the voltage $U_g$ is divided between the branches of the oscillatory circuit forming the compensating-voltage producing device 11 and the output circuit of the triode 3, as a result of which a voltage opposite in phase to the voltages $U_g'$ and $U_g$ is produced across the load 12. Since the reactances 26 and 27 are of the same sign, the compensating voltage $U_k$ in-phase with the voltage across the load 12 and, hence, opposite in phase to the input voltage $U_g'$ is developed across the reactance 27. As mentioned above, in this case the output voltage $U_e$ of the exciter 1 appears to be less than the input voltage $U_g'$ of the amplifier stage 2, which ensures a reduction in the power taken off from the exciter 1 and an increase in the power gain provided by the amplifier stage 2, the value of the power gain being dependent on the relation between the amplitudes of the voltages $U_k$ and $U_g'$ in accordance with the relationship between the voltages $U_e$ and $U_k$ which was described in detail hereinabove.

Beyond the passband of such a generator the equivalent impedance of the oscillatory circuit forming the output circuit of the triode 3 is sharply reduced, which results in a drastic decrease in the amplitude of the compensating voltage $U_k$. Due to this, the possibility of self-excitation of the amplifier stage 2 at frequencies beyond its passband is practically eliminated, which makes it possible to simplify the construction of the exciter 1 since it need not have a high internal impedance at nonoperating frequencies.

In the generator made in accordance with FIG. 4 there is provided an automatic protection of the active element of the output amplifier stage on a sharp decrease in the impedance of the output circuit, such as when the oscillatory circuit forming this output circuit is detuned, whereas in prior-art generators a decrease in the impedance of the output circuit causes an increase in the power dissipated in the collector electrode of the active element, which may result in the failure of the latter, conventional overload protection devices being inoperable since the anode current in this case does not increase. In the generator shown in FIG. 4 a sharp decrease in the voltage across the load 12 results in a drastic reduction in the compensating voltage $U_k$ so that the input impedance of the amplifier stage 2 sharply increases and the exciter 1 is no longer a power supply, the drive current $I_e$ being reduced, which causes a reduction in the control voltage $U_g$ on the grid 5 of the triode 3, in the anode current $I_a$, and in the power dissipated in the anode 6 of the triode 3.

Making the generator in accordance with FIG. 4 makes it possible to simplify the construction of the amplifier stage 2 by combining the functions of the output circuit of the active element and of the compensating-voltage producing device 11 in a single oscillatory circuit.

A similar generator with the compensating-voltage producing device made as the parallel resonant oscillatory circuit forming the output circuit of the active element of the output amplifier stage may also utilize a tetrode, the construction and all of the circuit connections being the same as shown in FIG. 4 and the control and screen grids of the tetrode being short-circuited with each other for high frequencies, such as by means of a capacitance connected therebetween.

Figure 5:
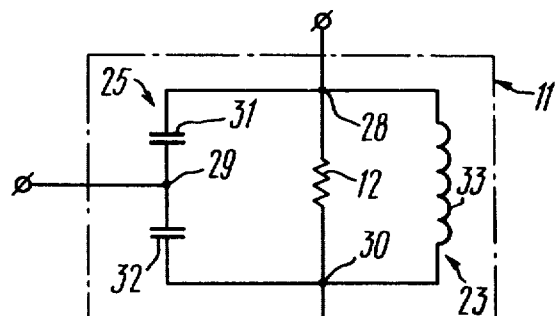
FIG. 5 shows a schematic circuit diagram of one of the embodiments of the parallel resonant oscillatory circuit forming the compensating-voltage producing device for the electric oscillation generator according to FIGS. 4 or 9.
Figure 6:
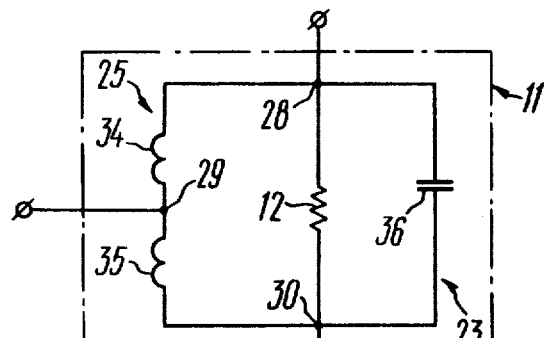
FIG. 6 shows a schematic circuit diagram of another embodiment of the parallel resonant oscillatory circuit forming the compensating-voltage producing device for the electric oscillation generator according to FIGS. 4 or 9.
Figure 7:
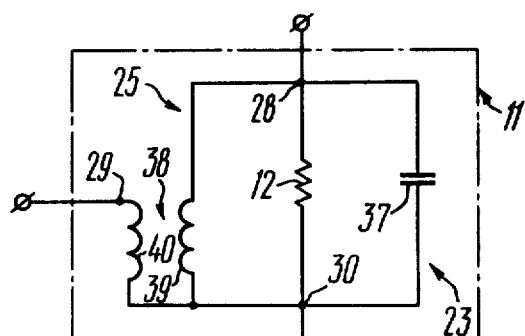
FIG. 7 shows a schematic circuit diagram of still another embodiment of the parallel resonant oscillatory circuit forming the compensating-voltage producing device for the electric oscillation generator according to FIGS. 4 or 9.

FIGS. 5, 6 and 7 show schematic circuit diagrams of possible embodiments of the oscillatory circuit forming the output circuit of the triode 3 for the generator shown in FIG. 4.

In one of these oscillatory circuits (FIG. 5) the voltage divider in the branch 25 is formed by two capacitances 31 and 32 and the parallel branch 23 is formed by the inductance 33.

In another embodiment of the oscillatory circuit (FIG. 6) the voltage divider in the branch 25 is formed by two inductances 34 and 35 and the branch 23 is formed by a capacitance 36.

Still another embodiment of the oscillatory circuit is shown in FIG. 7. This oscillatory circuit in the branch 23 contains a capacitance 37. The voltage divider in the branch 25 is formed by a transformer 38 whose primary winding 39 is connected between the extreme points 28 and 30 of the divider and a secondary winding 40 is connected with its one end to the primary winding 39. The other end of the secondary winding 40 forms the middle point 29 of the voltage divider. In this case it is quite easy to define the extreme points 28, 30 and middle point 29 of the voltage divider if a well known transformer equivalent circuit is used which takes into account not only winding inductances, but also a leakage inductance.

The construction diagram (FIG. 8) shows one of the most rational embodiments of the electric oscillation generator according to FIG. 4 in which the oscillatory circuit forming the output circuit of the triode 3 and constituting the compensating-voltage producing device 11 is constructed in accordance with a schematic circuit diagram shown in FIG. 6.

Figure 8:
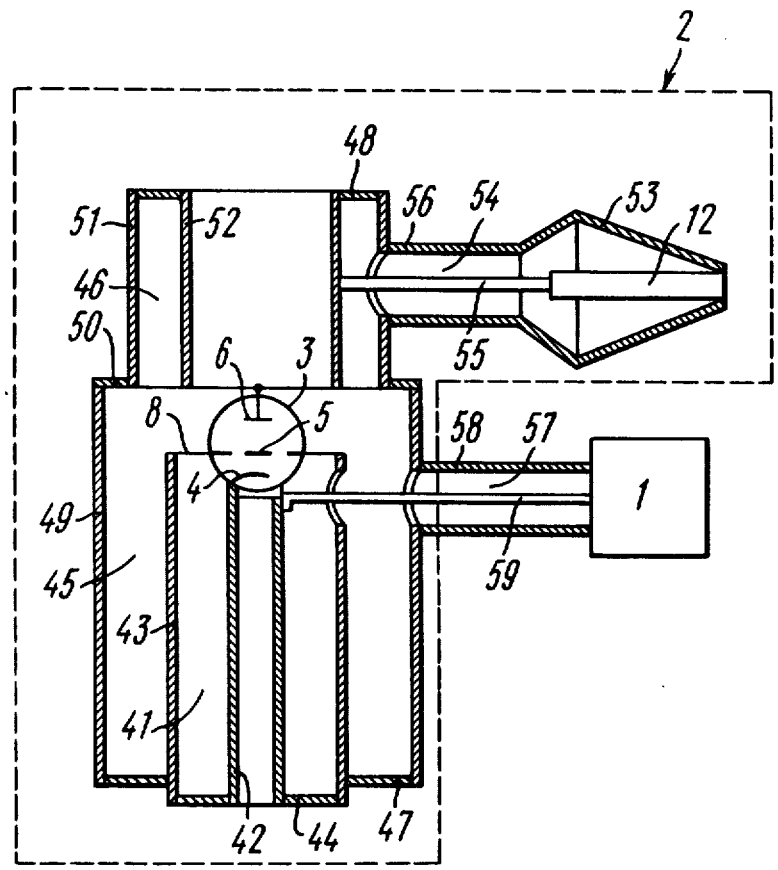
FIG. 8 shows a diagram of construction of the electric oscillation generator according to FIG. 4 with the oscillatory circuit according to FIG. 6, the oscillatory system utilizing coaxial lines.

Referring to FIG. 8, the oscillatory circuits in the input and output circuits of the triode 3 of the output amplifier stage 2 are made utilizing segments of coaxial lines.

The oscillatory circuit in the input circuit of the triode 3 is formed by a capacitance between the cathode 4 and grid 5 of the triode 3, which constitutes the reactance 19 of the branch 18 of the oscillatory circuit (FIG. 4), and by a segment 41 of a coaxial line (FIG. 8) with a central conductor 42 and an outer conductor 43, which constitutes the inductive branch 20 of the oscillatory circuit (FIG. 4). The segment 41 of a line (FIG. 8) is shorted out at its one end by an annular jumper 44, and the opposite ends of its central conductor 42 and outer conductor 43 are connected to the cathode 4 and grid 5 of the triode 3, respectively. The electrical length of the segment 41 of a coaxial line is less than a quarter of the wavelength of oscillations supplied from the exciter 1 to the amplifier stage 2.

The oscillatory circuit in the output circuit of the triode 3 is formed by a capacitance between the grid 5 and anode 6 of the triode 3, which constitutes the reactance 24 in the branch 23 of the oscillatory circuit (FIG. 4) and corresponds to the capacitance 36 in FIG. 6 and also by two series-connected segments 45 and 46 of coaxial lines (FIG. 8) shorted out at their ends by annular jumpers 47 and 48. The segments 45 and 46 correspond to inductances 34 and 35 (FIG. 6) of the voltage divider of the branch 25 of the oscillatory circuit. The outer conductor 43 of the segment 41, connected to the grid 5 of the triode 3, serves as a central conductor of the segment 45 (FIG. 8) so that the input and output circuits of the triode 3 have a common point 8 of connection with its grid 5. An outer conductor 49 of the segment 45 is connected by an annular jumper 50 with an outer conductor 51 of the segment 46 whose central conductor 52 is connected to the anode 6 of the triode 3. The point of connection of the outer conductors 49 and 51 of the segments 45 and 46 corresponds to the middle point 29 of the voltage divider (FIG. 6). The resistive load 12 (FIG. 8) disposed in a coaxial screen 53 is connected to the parallel segment 46 by means of a feeder 54 whose central conductor 55 communicates the load 12 with the central conductor 52 of the segment 46, and an outer conductor 56 communicates the screen 53 with the outer conductor 51 of the segment 46.

The output of the exciter 1 is connected to the amplifier stage 2 by means of a feeder 57. An outer conductor 58 of the feeder 57 is connected with the outer conductor 49 of the segment 45 close to the point of connection of the conductor 49 with the outer conductor 51 of the segment 46 such that the outer conductor 58 of the feeder 57 represents the output terminal 10a of the exciter 1, connected to the middle point 29 of the voltage divider (FIG. 6). An inner conductor 59 (FIG. 8) of the feeder 57 passes through coaxially arranged holes in the conductors 49 and 43 of the segments 45 and 41, is connected to the inner conductor 42 of the segment 41, and represents the output terminal 10b of the exciter 1, connected to the section of the input circuit of the triode 3.

Figure 9:
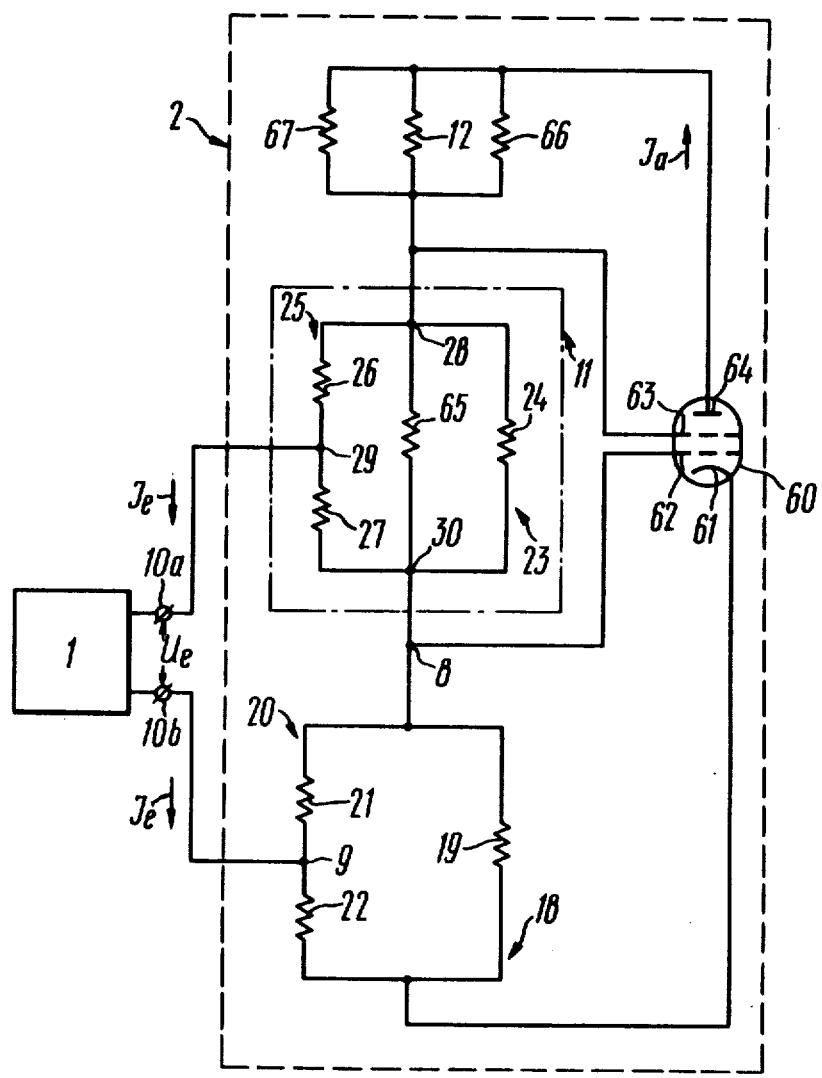
FIG. 9 shows a circuit diagram of the electric oscillation generator with a tetrode amplifier stage and a compensating-voltage producing device made as a parallel resonant oscillatory circuit connected between the control and screen grids of the tetrode.

FIG. 9 shows a functional circuit diagram of the generator having a tetrode 60 with a cathode 61, control grid 62, screen grid 63, and anode 64, utilized therein as the controlled active element of the output amplifier stage 2.

In such a generator the input circuit of the tetrode 60 is made as a parallel resonant oscillatory circuit connected between the cathode 61 and control grid 62 of the tetrode 60. The construction and connections of this oscillatory circuit are similar to those of the oscillatory circuit forming the input circuit of the triode 3 in the generator whose circuit diagram is shown in FIG. 4.

The compensating-voltage producing device 11 is made as a parallel resonant oscillatory circuit whose construction is similar to that of the oscillatory circuit performing the function of the compensating-voltage producing device 11 in the generator whose circuit diagram is shown in FIG. 4, but instead of the useful load 12 a ballast load 65 whose impedance is resistive in its effect is connected parallel to the branches 23 and 25 of the oscillatory circuit. This oscillatory circuit is connected between the control grid 62 and screen grid 63 of the tetrode 60. The extreme point 28 of the voltage divider formed by the reactances 26 and 27 is electrically coupled with the anode 64 of the tetrode 60 through its output circuit which is made as a parallel resonant oscillatory circuit whose branches respectively contain reactances 66 and 67. The useful load 12 is connected into this output circuit parallel to the branches of the oscillatory circuit, i.e. parallel to the reactances 66 and 67. The section of the input circuit, formed by the reactance 21 and bounded by the points 8 and 9, is connected to the output of the exciter 1 through the compensating-voltage producing device 11 in series with the reactance 21 in the same way as in the generator whose circuit diagram is shown in FIG. 4.

The compensating voltage $U_k$ in this generator is produced in a similar way as in the generator shown in FIG. 4 and developed across the reactance 27 of the voltage divider in the branch 25 of the oscillatory circuit. However, connection of this oscillatory circuit between the control grid 62 and screen grid 63 of the tetrode 60 enables the compensating voltage $U_k$ to be independent of the resistance of the useful load 12 connected to the output circuit of the tetrode 60. Hence, such a generator can be efficiently used to operate a variable load 12.

Besides, production of the compensating voltage $U_k$ in the generator shown in FIG. 4 requires a portion of the power developed in the output circuit of the triode 3, while in the generator shown in FIG. 9 the power is not taken off from the output circuit of the tetrode 60 to produce the compensating voltage $U_k$. Hence, the power developed in the load 12 of the generator shown in FIG. 9 exceeds the power developed in the load 12 of the generator shown in FIG. 4 by a value equal to the product of the compensating voltage $U_k$ by the anode current $I_a$, the values of the anode currents $I_a$ and of the resistances of the load 12 for both generators being equal.

In the generator whose circuit diagram is shown in FIG. 9 the oscillatory circuit connected between the control grid 62 and screen grid 63 of the tetrode 60 may be made, for example, in accordance with one of the schematic circuit diagrams shown in FIGS. 5, 6 and 7.

Figure 10:
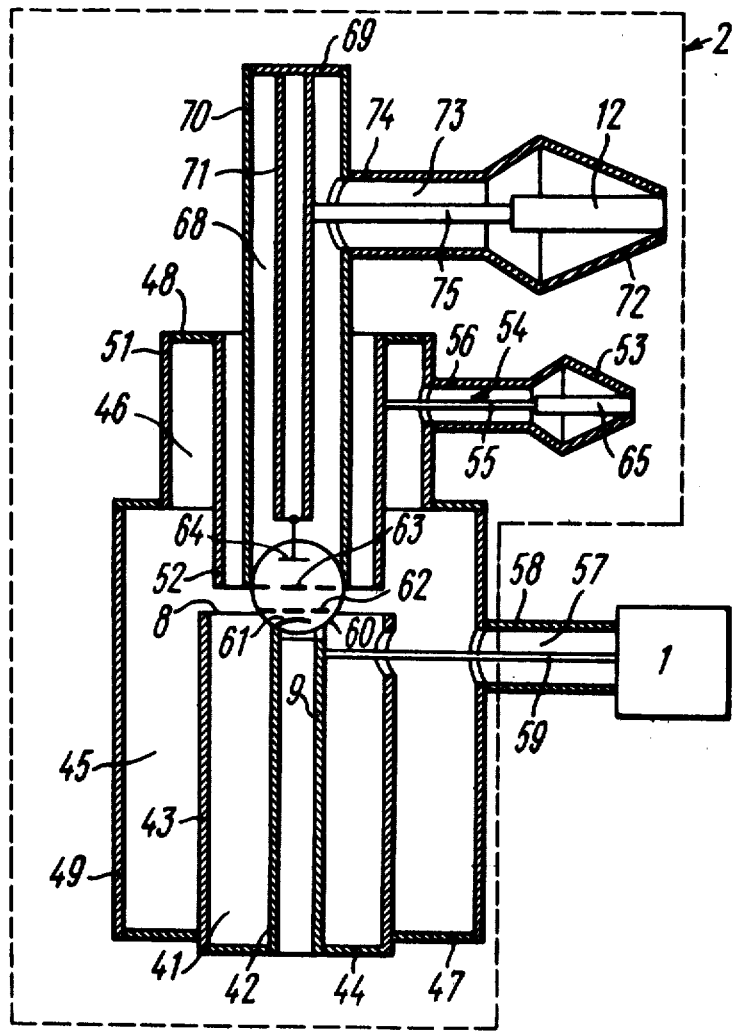
FIG. 10 shows a diagram of construction of the electric oscillation generator according to FIG. 9 with the oscillatory circuit according to FIG. 6, the oscillatory system utilizing coaxial lines.
Figure 7:
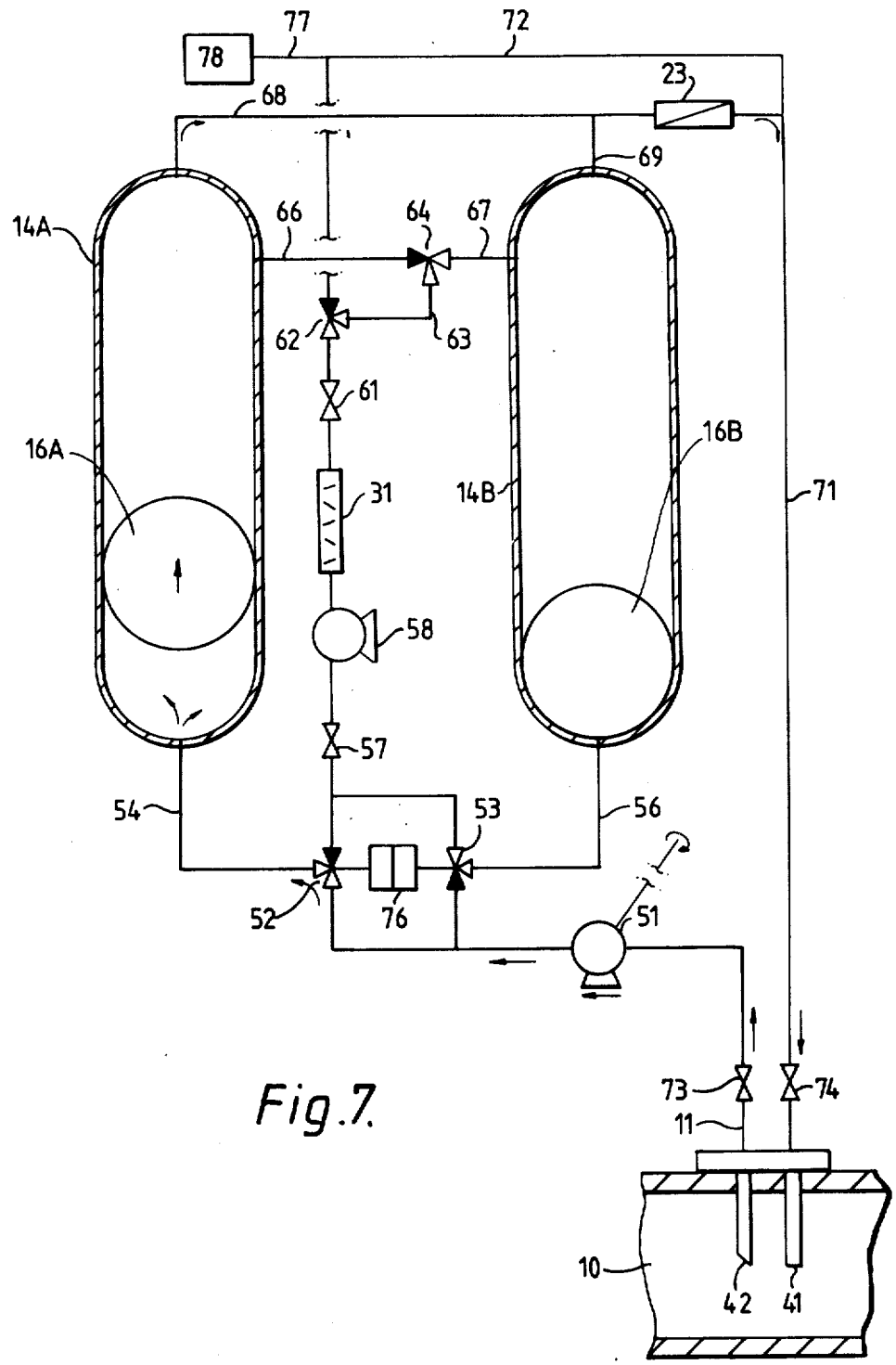

The constructional embodiment of the generator shown in FIG. 9 in which the oscillatory circuit forming the compensating-voltage producing device 11 is made in accordance with the circuit diagram of FIG. 6 is illustrated in FIG. 10. The oscillatory circuits of this generator utilize coaxial lines with the use of interelectrode capacitances similarly to the construction shown in FIG. 8 which illustrates the generator of FIG. 4 with the oscillatory circuit of FIG. 6.

In distinction to the construction shown in FIG. 8, in the generator under consideration (FIG. 10) the inner conductor 52 of the segment 46 of a coaxial line is connected to the screen grid 63 of the tetrode 60 such that the oscillatory circuit performing the function of the compensating-voltage producing device 11 is formed by the segments 45 and 46 of coaxial lines and by a capacitance between the control grid 62 and screen grid 63 of the tetrode 60 and is connected between the grids 62 and 63. The ballast load 65 is connected parallel to the segment 46 instead of the useful load 12.

The output circuit of the tetrode 60 is made as an oscillatory circuit formed by a capacitance between the screen grid 63 and the anode 64, corresponding to the reactance 66 (FIG. 9), and by a segment 68 (FIG. 10) of a coaxial line, shorted out at its end by an annular jumper 69. An outer conductor 70 of the segment 68 is connected to the screen grid 63, and its inner conductor 71 is connected to the anode 64 of the tetrode 60. The segment 68 represents an inductance corresponding to the reactance 67 (FIG. 9). The useful load 12 is disposed in a coaxial screen 72 and connected parallel to the segment 68 by means of a feeder 73 whose outer conductor 74 and inner conductor 75 are connected to the outer conductor 70 and inner conductor 71 of the segment 68, respectively.

Still another embodiment of the electric oscillation generator is shown in FIG. 11. In this generator the output amplifier stage 2 utilizes the triode 3, and its input circuit is similar to that of the generator shown in FIG. 4.

The compensating-voltage producing device 11 represents a passive multi-terminal network which is made as a system of two resonant oscillatory circuits 76 and 77 coupled with each other by autotransformer coupling. This system of coupled oscillatory circuits 76 and 77 forms the output circuit of the triode 3.

The oscillatory circuit 76 is a parallel resonant oscillatory circuit whose one branch contains a capacitance 78 and the other branch contains series-connected inductances 79 and 80 which are interconnected at points 81 and 82. One of these points is connected to the anode 6 of the triode 3, and the other point is connected to the point 8 of the section of the input circuit of the triode 3, formed by the reactance 21. The oscillatory circuit 77 comprises two branches one of which contains the inductance 80 thus representing an inductance of coupling between the oscillatory circuits 76 and 77 and inductances 83 and 84 connected in series with the inductance 80, and the other branch includes a capacitance 85. The load 12 is connected between the points 86 and 87 of connection of the branches of the oscillatory circuit 77. The point 86 of the oscillatory circuit 77 is connected to the output terminal 10a of the exciter 1.

As this generator operates, the compensating voltage $U_k$ is developed across the inductance 84, this voltage being close in phase to the voltage across the oscillatory circuit 76 between the points 81 and 82 and, hence, approximately opposite in phase to the input voltage $U'$ across the reactance 21. Due to this, as well as in the embodiments considered hereinabove, the power taken off from the exciter 1 is reduced.

Generation of the compensating voltage in the circuit of one of the coupled oscillatory circuits forming the output circuit of the active element of the amplifier stage provides maintenance of a required relationship between the amplitudes and phases of the voltages $U_k$ and $U_g'$ in a broader frequency band than that in the case of a single oscillatory circuit, which is due to a broad passband of a system of coupled oscillatory circuits. Owing to this, the power taken off from the exciter 1 is also almost invariable within a broad frequency band, as a result of which widening of the frequency band without an increase in the power of the exciter 1 is achieved. At the same time, such a generator, as well as the generator shown in FIG. 4, provides an automatic protection of the triode 3 in case of a sharp increase in the impedance of its output circuit.

Figure 12:
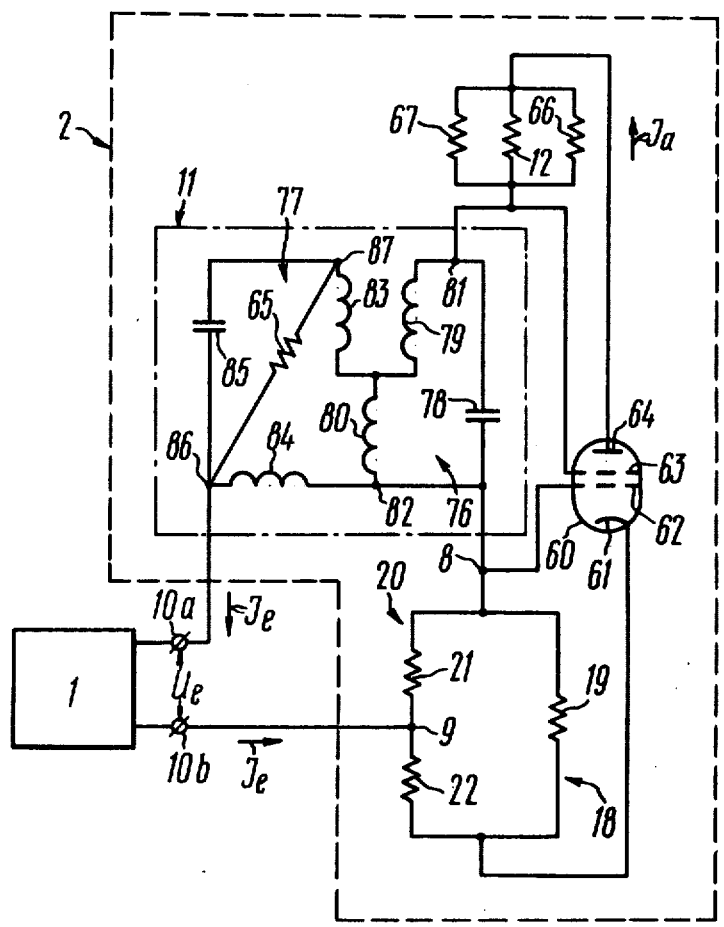
FIG. 12 shows a schematic circuit diagram of the electric oscillation generator with a tetrode amplifier stage and a compensating-voltage producing device made as a system of two coupled oscillatory circuits which is connected between the control and screen grids of the tetrode.

Another version of the use of a system of coupled oscillatory circuits as the compensating-voltage producing device 11 is explained by a circuit diagram shown in FIG. 12. In this embodiment of the electric oscillation generator the tetrode 60 is utilized as the active element of the amplifier stage 2, and its input and output circuits are the same as those in the generator whose circuit diagram is shown in FIG. 9. The system of two coupled oscillatory circuits 76 and 77, performing the function of the compensating-voltage producing device 11, is made in accordance with the circuit diagram utilized in the generator shown in FIG. 11, the ballast load 65 being included into the oscillatory circuit 77 instead of the useful load 12 and the useful load 12 being connected into the oscillatory circuit forming the output circuit of the tetrode 60. Such a system of coupled oscillatory circuits 76 and 77 is connected between the control grid 62 and screen grid 63 of the tetrode 60. To this end, the point 81 of the parallel oscillatory circuit 76 is connected to the grid 63, and the point 82 is connected to the grid 62 at the point 8.

The principle of development of the compensating voltage $U_k$ across the inductance 84 of the oscillatory circuit 77 in such a generator is the same as that in the generator whose circuit diagram is shown in FIG. 11. However, in the described circuit the constructing voltage $U_k$ is independent of the resistance of useful load 12 within a broad frequency band.

In electric oscillation generators made in accordance with the present invention the compensating-voltage producing device may be formed not only by resonant oscillatory circuits representing three- or four-terminal networks, but also by any other passive multi-terminal network, such as by a transformer, by a capacitance, or by a more complex combination of passive elements. This passive multi-terminal network should be connected such that one of its terminals is electrically coupled with the collector electrode of the active element and two other terminals are respectively connected to the output terminal 10a of the exciter 1 (FIGS. 1-12) and to the point 8 of the input circuit of the active element. This multi-terminal network should be made such as to provide phase shift of the compensating voltage $U_k$ with respect to the input voltage $U_g'$ by an angle at which the sum of these two voltages is less than the voltage $U_g'$, which may be achieved, for example, when these voltages are opposite in phase.

Figure 13:
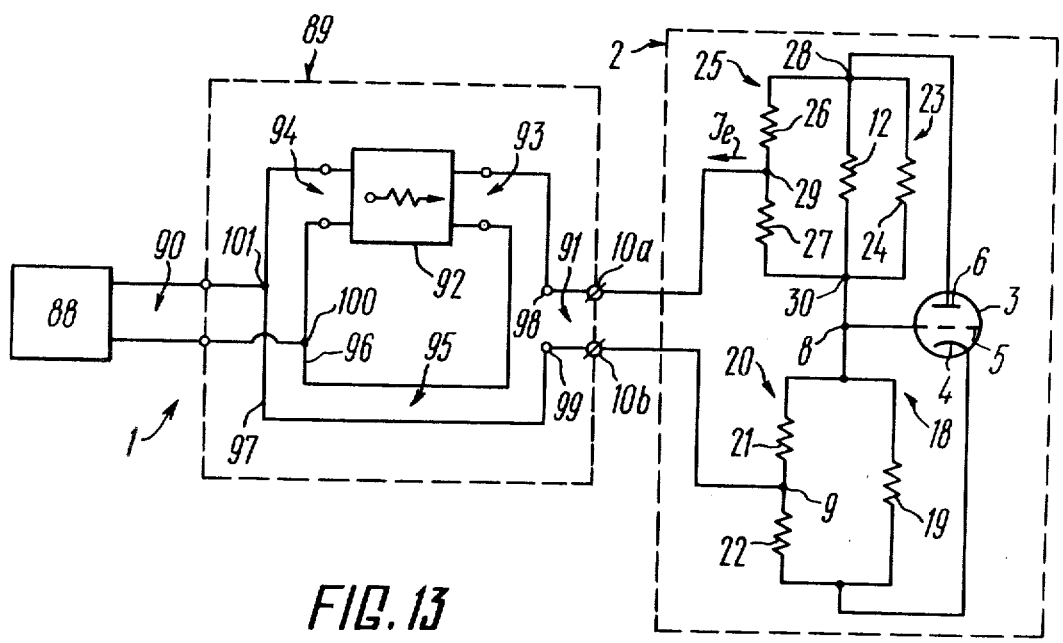
FIG. 13 shows a schematic circuit diagram of the electric oscillation generator with a matching device at the exciter output.

FIG. 13 shows a generator in which the exciter 1 is complete with a matching device providing a high internal impedance of the exciter 1.

In accordance with FIG. 13, the exciter 1 comprises a source 88 of high-frequency oscillations and a matching device 89 connected between the source 88 and the output amplifier stage 2.

The matching device 89 comprises an input transmission line 90, an output transmission line 91 and a nonreciprocal passive four-terminal network representing a ferrite isolator 92 having an output 93 and an input 94. The isolator 92 is made such that attenuation of the wave travelling in a forward direction, i.e. from the input 94 to the output 93, is low, and attenuation of the wave travelling in the opposite direction, i.e. from the output 93 to the input 94, is high. The matching device 89 also comprises a segment 95 of a line, communicating the output 93 of the isolator 92 with its input 94 and consisting of conductors 96 and 97. An overal electrical length of the segment 95 and of the isolator 92 has a value which is not a multiple to the length of a half-wave of oscillations produced by the source 88 of high-frequency oscillations. The wave impedance of the segment 95 of a line is equal to the impedance of the isolator 92. The output line 91 is connected into a break of the conductor 97 between points 98 and 99, and the input transmission line 90 is connected to points 100 and 101 of the conductors 96 and 97 of the segment 95, the points of connection of the output line 91 being disposed in the section of the segment 95 between the output 93 of the isolator 92 and the points 100 and 101.

The generator shown in FIG. 13 operates as follows.

High-frequency oscillations from the source 88 are supplied via the input line 90 to the segment 95 of a line, thus forming two electromagnetic waves one of which propagates from the points of connection of the input line 90 along the segment 95 toward the input 94 of the isolator 92, and the other travels from the points of connection of the input line 90 toward the output 93 of the isolator 92. The wave propagating toward the output 93 is attenuated in the isolator 92, and in the section of the line 95, disposed between the input 94 of the isolator 92 and the points 100 and 101 of connection of the input line 90, there is no wave. Since the wave impedance of the segment 95 is equal to the impedance of the isolator 92, the impedance between the points 101 and 100 for the wave propagating from these points toward the output 93 of the isolator 92 is resistive in its effect and equal to the wave impedance of the segment 95. The second wave propagating toward the input 94 of the isolator 92 is not attenuated when passing through the isolator 92 and travels further thus producing between the points 100 and 101 a voltage phase shifted with respect to the voltage produced between these points by the source 88, the phase shift being defined by an electrical length of a circuit including the segment 95 and the isolator 92, as a result of which the impedance between the points 100 and 101 for the second wave is reactive in its effect and defined by the electrical length of the circuit including the segment 95 and the isolator 92. Since the electrical length of the circuit consisting of the segment 95 and isolator 92 is not a multiple to the half wavelength of amplified oscillations, the reactance between the points 100 and 101 will have a finite value.

The current of the second wave is the current $I_e$ of the exciter of the output amplifier stage 2.

Thus, the total impedance between the points 100 and 101 as viewed from the input line 90 appears to be equal to the impedance of the circuit consisting of parallel connected impedances one of which is equal to the wave impedance of the line 95 and the other is equal to the reactance for the wave propagating toward the input 93 of the isolator 92. At the same time, as shown in FIG. 13, the impedance of the amplifier stage 2 between the points 98 and 99 as viewed from the amplifier stage 2 is equal to the impedance of a circuit consisting of series-connected impedances one of which is equal to the wave impedance of the segment 95 and the other is equal to the reactance for the wave propagating from the input line 90 to the input 94 of the isolator 92. Thus, the internal impedance of the exciter 1 cannot be less than the wave impedance of the line 95 irrespective of the value of the internal impedance of the source 88 of high-frequency oscillations, which makes it possible to provide a high internal impedance of the exciter 1 by using the matching device 89 in which the segment 95 has a high wave impedance. It is advisable to use the matching device 89 when the internal impedance of the source 88 is insufficient, such as due to shunting effect of the feeder connected to the output of the source 88.

Figure 14:
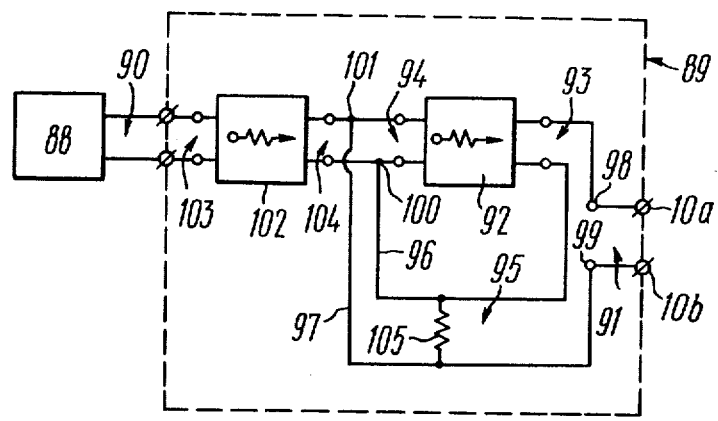
FIG. 14 shows a circuit diagram of another embodiment of the matching device.

FIG. 14 shows a circuit diagram of the matching device 89, making it possible to reduce the power of the source 88 of high-frequency oscillations and to provide its operation into a constant load.

In accordance with FIG. 14 the matching device comprises one more nonreciprocal multi-terminal network representing an isolator 102 connected into the break of the input transmission line 90 such that its input 103 faces the output of the source 88 of high-frequency oscillations and its output 104 faces the points of connection of the line 90 with the segment 95.

The circuit includes a reactance 105 connected parallel to the segment 95 between the points of connection of the input transmission line thereto and the output 93 of the isolator 92, and having a sign opposite to that of the reactance of the segment 95 at the points of connection of the line 90 thereto and an absolute value exceeding a half of the absolute value of the reactance of the segment 95 at said points.

Since the input impedance of the isolator 102 is independent of the impedance between the points 100 and 101 as viewed from the input line 90, the use of the isolator 102 provides constancy of the load into which the source 88 operates and thus enables the construction of the source 88 to be simplified.

Connection of the reactance 105, which has a value chosen in a way mentioned above, to the segment 95 provides a higher total reactance between the points 100 and 101 as viewed from the input line 90 since in this case said total reactance is equal to the impedance of the parallel resonant oscillatory circuit in which one branch is formed by the reactance of the segment 95 and the other is formed by the reactance 105. This makes it possible to increase the drive current $I_e$ supplied from the exciter 1 to the amplifier stage 2 (FIG. 13) without an increase in the power of the source 88.

Figure 15:
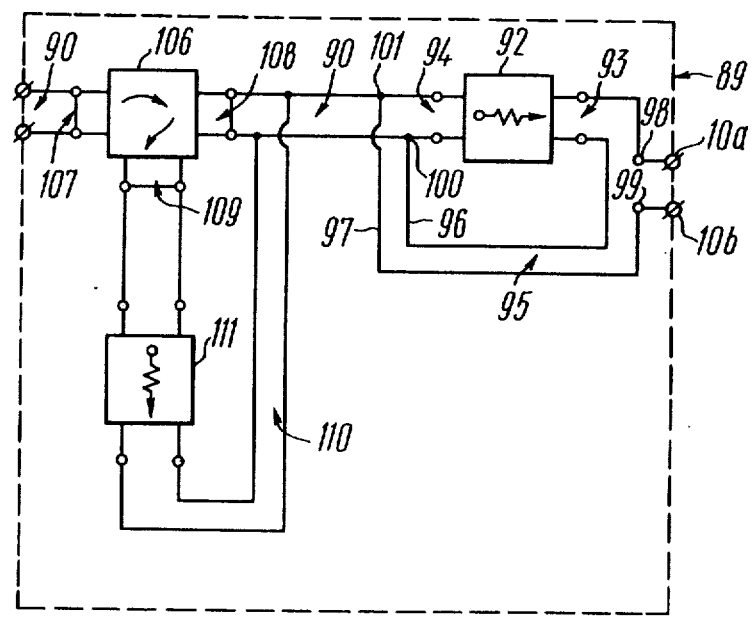
FIG. 15 shows a circuit diagram of still another embodiment of the matching device.

FIG. 15 shows a circuit diagram of the matching device 89, providing a high internal impedance of the exciter 1.

Referring to FIG. 15, there is shown the matching device 89 comprising a nonreciprocal passave multi-terminal network connected in a forward direction into the input transmission line 90 and representing a circulator 106 connected at a distance from the points of connection of the line 90 to the segment 95, equal to an odd number of quarters of the wavelength of oscillations of the source 88. An input port 107 of the circulator 106 faces the output of the source 88, and an output port 108 of the circulator 106 faces the segment 95 and is connected to a ballast port 108 of the circulator through a transmission line 110 into which another nonreciprocal passive multi-terminal network is connected, this network being made as an isolator 111 connected into the line 110 in a forward direction, i.e. in the same direction as that of a current flow via the circulator 106 from the output port 108 to the ballast port 109. The parameters of the transmission line 110 and isolator 111 are chosen such that the overall electrical length of the line 110 together with the isolator 111 and circulator 106 is a multiple to the wavelength of oscillations produced by the source 88.

With such an electrical length of the circuit formed by the line 110 and isolator 111, the impedance between the points of connection of the lines 96 and 110 as viewed from the segment 95 is equal to zero. Since the distance between said points and the points 100 and 101 is equal to an odd number of quarters of the wavelength, the impedance between the points 100 and 101 for the waves propagating from the output line 90 to the input 94 of the isolator 92 in this case is very high. This makes it possible to attain a very high internal impedance of the exciter 1, which impedance is summed up, as mentioned hereinabove, by the wave impedance of the segment 95 and the impedance between the points 100 and 101.

Industrial Applicability

In accordance with the invention there was constructed an experimental electric oscillation generator in which the output amplifier stage utilizes a tetrode according to FIGS. 9 and 10. The generator was designed to operate at a frequency of 350 MHz with a passband of the anode circuit equal to 5 MHz. The output power of the generator developed in the useful load was equal to 16 W with an excitation power of 37.5 mW. Thus, the amplifier stage of the generator made in accordance with the invention provided a power gain of 425.

For comparison, there was constructed a similar reference generator in which the same tetrode was connected in a prior-art (conventional) common-grid circuit. The oscillatory circuits of the input and output circuits of the tetrode were made in the same way as those of the expiremental generator, and the control and screen grids were shorted out for high frequencies. In the reference generator the operation in the same frequency band to obtain the output power of 16 W required an excitation power of 640 mW, i.e. the power gain of the output amplifier stage is equal to 25 which is 17 times less than that in the expiremental generator. The invention makes it possible to create new generators of low, medium and high power intended for operation in any frequency band, primarily in the range of metric, decimetric and centimetric waves. Such generators make it possible to obtain in the amplifier stage a power gain which is 10, 100, 1000 and more times higher than that in prior-art generators made utilizing a common-grid circuit. Thus, for example, in a number of cases instead of a multistage generator the entire high-frequency section may comprise only an output amplifier stage utilizing a powerful vacuum tube and a transistor exciter.

The possibility to modernize existing generators is also an important feature of application of the present invention since realization of the invention does not require complex means. Such a modernization primarily consists in mere elimination of a number of intermediate amplifier stages, such as in radio and television transmitters, which may give vacuum-tube transmitters undeniable advantages over klystron and travelling-wave tube transmitters.

The proposed invention may be also employed when creating new electronic grid-controlled devices. It is well known that a low power gain and a short life are the main disadvantages of vacuum tubes. The present invention have contemplated the ways to eliminate both of these disadvantages. Indeed, the parameters of such tubes are improved mainly by perfecting the processes of their fabrication, which makes it possible to produce devices with better parameters but rather difficult in fabrication, i.e. with parameters approximating the limiting values. The use of the proposed invention will make it possible to simplify to a degree the requirements placed upon some tube parameters, such as there will be no need for a particularly high transconductance of devices, which allows an increase in the distance between the control grid and the cathode and a slight decrease in the filament voltage, and that will extend the life of the devices.

Of no less interest is the solution of more specific problems, such as the problem of electronic protection of powerful tubes for high-frequency bands when, on detuning, anode losses with a nominal anode current are substantially increased. In this case in the generator made in accordance with the present invention the compensating voltage drops down, the input impedance of the output amplifier stage increases, and the exciter does not provide the initial value of the input voltage. Such a protection does not require any additional devices and in combination with conventional high-speed electronic protection makes it possible to protect the tube comprehensively against overloads.

Thus, due to said features and advantages, the present invention opens up new trends in the development of vacuum-tube and transistor high-frequency radio apparatus and serves as the basis for further progress in this field.

We claim:

1. An electric oscillation generator comprising an exciter generating electric oscillations; an output amplifier amplifying the power of said electric oscillations generated by said exciter, said output amplifier having a controlled active element with an input circuit, an emitting electrode, a control electrode and a collector electrode, said input circuit being connected between said emitting and control electrodes, an input section of said input circuit connected to an output of said exciter and through which at least a portion of the current of said electric oscillations flows; wherein the improvement comprises: said exciter is made with respect to the circuits of said output amplifier and said output amplifier serves as a power source for said exciter; and, a compensating-voltage producing device connecting said input section to said output of said exciter and connected in series with said input section, an output voltage of said compensating-voltage producing device having a frequency equal to the frequency of the electric oscillations generated by said exciter and having its phase shifted with respect to the voltage across said input section so the sum of the output voltage of said compensating-voltage producing device and said voltage across said input section is less than said voltage across said input section.

2. A generator according to claim 1, wherein a source of amplitude-modulated oscillations is used as the exciter; and the compensating-voltage producing device is made as a source of alternating voltage nonmodulated in amplitude, which is synchronized with the exciter and has an output circuit connected in series with said input section of the input circuit of the active element and communicating said input section with the output of the exciter.

3. A generator according to claim 1, wherein the compensating-voltage producing device is made as a passive multi-terminal network having one of its terminals electrically coupled with a collector electrode of the active element and two terminals connected, respectively, with the output of the exciter and with said input section of the input circuit of the active element, the circuit of the multi-terminal network between these two terminals is in series with said input section of the input circuit, and the multi-terminal network being made such that flowing therethrough of at least a portion of the current of oscillations fed from the exciter to the amplifier produces between said two terminals a voltage phase shifted with respect to the voltage across said input section of the input circuit so that the sum of these two voltages is less than the voltage across said input section of the input circuit.

4. A generator according to claim 3, wherein the passive multi-terminal network is made as a parallel resonant oscillatory circuit, one of whose branches is made as a voltage divider formed by two reactances of the same sign, a first extreme point of this voltage divider being electrically coupled with the collector electrode of the active element and a middle point and second extreme point thereof being connected with the output of the exciter and with said input section of the input circuit of the active element, respectively.

5. A generator according to claim 4, wherein said parallel resonant oscillatory circuit forms the output circuit of the active element of the amplifier.

6. A generator according to claim 4, wherein a tetrode is used as the controlled active element of the amplifier, said parallel resonant oscillatory circuit is connected between the control grid and screen grid of the tetrode, the first extreme point of said voltage divider being electrically coupled with the collector electrode of the tetrode through its output circuit.

7. A generator according to claim 3, wherein the passive multi-terminal network is made as a system of first and second coupled resonant oscillatory circuits, said first parallel resonant oscillatory circuit has two branches having a first point of connection thereof electrically coupled with the collector electrode of the active element and a second point connected to said input section of the input circuit of the active element, the second resonant oscillatory circuit of said system being connected such that its network having a voltage close in phase to the voltage across said first parallel resonant oscillatory circuit is connected between said second point of connection of the branches of the first parallel oscillatory circuit and the output of the exciter.

8. A generator according to claim 7, wherein said system of first and second coupled resonant oscillatory circuits forms the output circuit of the active element of the amplifier.

9. A generator according to claim 7, wherein a tetrode is used as the controlled active element of the amplifier, said first parallel resonant oscillatory circuit is connected between the control grid and screen grid of the tetrode, the first point of connection of the branches of said first parallel oscillatory circuit being electrically coupled with the collector electrode of the tetrode through its output circuit.

* * * * *